US 9,293,505 B2

(12) United States Patent
Nabighian et al.

(10) Patent No.: US 9,293,505 B2
(45) Date of Patent: Mar. 22, 2016

(54) SYSTEM AND METHOD FOR BLACK COATING OF CAMERA CUBES AT WAFER LEVEL

(71) Applicant: OmniVision Technologies, Inc., Santa Clara, CA (US)

(72) Inventors: Edward Nabighian, San Jose, CA (US); Yi Qin, Shanghai (CN); Ward Zhang, Shanghai (CN); Alan Martin, San Jose, CA (US)

(73) Assignee: OmniVision Technologies, Inc., Santa Clara, CA (US)

( * ) Notice: Subject to any disclaimer, the term of this patent is extended or adjusted under 35 U.S.C. 154(b) by 0 days.

(21) Appl. No.: 14/270,281

(22) Filed: May 5, 2014

(65) Prior Publication Data
US 2015/0318325 A1 Nov. 5, 2015

(51) Int. Cl.
*H01L 27/146* (2006.01)
(52) U.S. Cl.
CPC .... *H01L 27/14685* (2013.01); *H01L 27/14687* (2013.01)
(58) Field of Classification Search
CPC ............ H01L 21/6835; H01L 21/6836; H01L 21/3043; H01L 31/0232
USPC .................... 438/460, 462, 463, 464; 257/432
See application file for complete search history.

(56) References Cited

U.S. PATENT DOCUMENTS

| | | | | |
|---|---|---|---|---|
| 8,251,601 | B2* | 8/2012 | Huang et al. | 396/529 |
| 8,599,301 | B2* | 12/2013 | Dowski et al. | 348/340 |
| 2006/0264006 | A1* | 11/2006 | Kian | H01L 21/3043 438/464 |
| 2011/0261550 | A1* | 10/2011 | Wong | H01L 21/561 361/818 |
| 2012/0155854 | A1* | 6/2012 | Huang | G03B 17/02 396/535 |
| 2014/0225131 | A1* | 8/2014 | Benson | G06F 1/1643 257/82 |

OTHER PUBLICATIONS

Menachem Genut ; Ofer Tehar-Zahav ; Eli Iskevitch ; Boris Livshits; Excimer laser photoresist stripping. Proc. SPIE 2724, Advances in Resist Technology and Processing XIII, 601 (Jun. 14, 1996).*

* cited by examiner

*Primary Examiner* — Marc Armand
*Assistant Examiner* — Christina Sylvia
(74) *Attorney, Agent, or Firm* — Lathrop & Gage LLP

(57) ABSTRACT

A method for black coating camera cubes at wafer level includes expanding the gap between individual diced camera cubes of the wafer by stretching tape securing the diced camera cubes. The method includes applying a black coating layer to the stretched camera cubes, laser trimming undesired portions of the black coating layer, and removing the undesired portions of the black coating layer.

14 Claims, 7 Drawing Sheets

SYSTEM AND METHOD FOR BLACK COATING OF CAMERA CUBES AT WAFER LEVEL

BACKGROUND

This invention relates to systems and methods for lens stack manufacturing. Particularly, a system and method for black coating a camera cube at wafer level.

Black coating within an optical lens system prevents undesirable light from interfering within the operation of the lens system. For example, black coating within the lens system prevents internal reflections and incident exterior (or other stray light) light from impinging on the optical sensor.

Currently the black coating on the outside surface of camera cubes (e.g. a lens stack) is deposited utilizing a process that requires (i) masking the aperture of each die independently, (ii) placing each die into a spaced grid one at a time for coating, and (iii) manually removing the masking one at a time.

For example, FIG. 1 depicts a prior art method 10 for black coating camera cubes and an associated visual diagram 100. For example, in step 1, a lens 104 is attached to a sensor 102. In step 2, a plurality of lens/sensor groups are placed in a carrier 106. In step 3, the lens locations of each lens 104 are masked with masking material 108. In step 4, black coating 110 is applied on the outer surface of the lens/sensor group and masking material 108. In step 5, the black coating layer 110 is laser trimmed (indicated by dashed lines 112) at the locations where black coating 110 is undesired. In step 6, masking layer 108 and undesired black coating layer 110 are manually removed from the lens/sensor groups. In step 7, each individual sensor/lens group is removed from carrier 106.

The current black coating process has many disadvantages. For example, the manual process required to create individual lens/sensor groups, place the groups in the carrier, and manually remove the masking and black coating layer is slow and labor intensive.

SUMMARY OF THE INVENTION

In one aspect of the disclosure is described a method for black coating camera cubes at wafer level, the method including: stretching a first tape attached to a wafer of the camera cubes to increase a gap between individual ones of the camera cubes; applying a layer of black coating material to the wafer of the camera cubes; laser trimming a pattern within the layer of black coating, the pattern defining undesired portions of the black coating material to be removed; and lifting off the undesired portions of the black coating material from the wafer.

In another aspect of the disclosure is described method for increasing the gap between individual camera cubes on a single wafer of a plurality of camera cubes, the method including stretching, in a first direction, a first tape attached to the wafer of camera cubes to increase the gap to a first distance.

DETAILED DESCRIPTION OF THE DRAWINGS

The systems and methods for black coating camera cubes at wafer level described below may be used in conjunction with a lens and sensors bonded together in any of the methods disclosed in U.S. patent application Ser. No. 14/269,879, filed May 5, 2014, entitled "Wafer Level Bonding Method For Camera Fabrication" and which is incorporated by reference herein.

Figure 1:
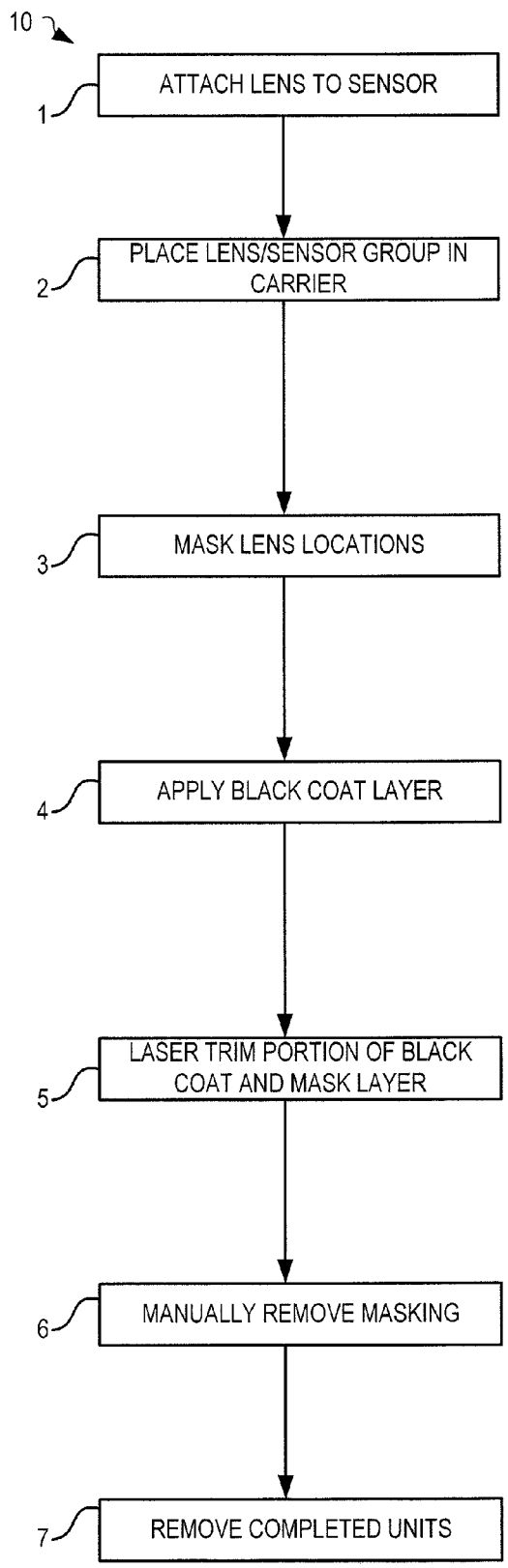
FIG. 1 depicts a prior art method for black coating camera cubes and an associated visual diagram.
Figure 1:
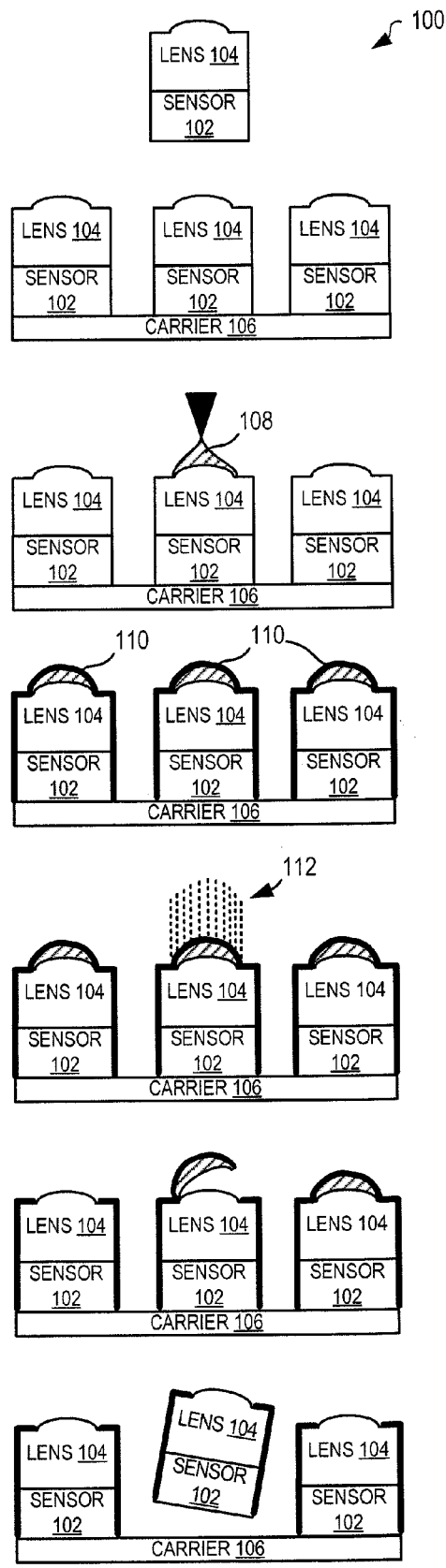
Figure 2:
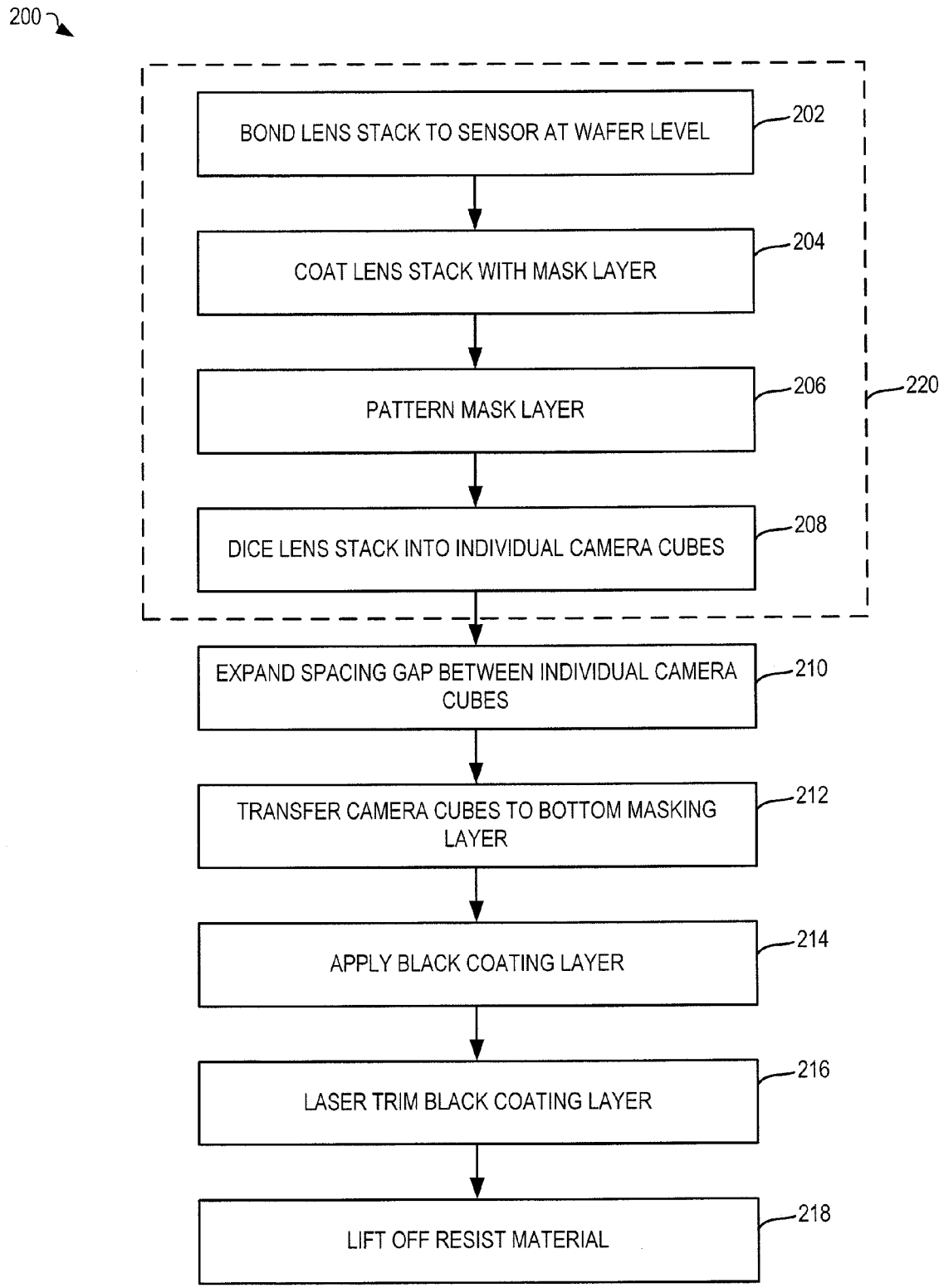
FIG. 2 depicts a method for black coating camera cubes at a wafer level, in one embodiment.
Figure 3A:
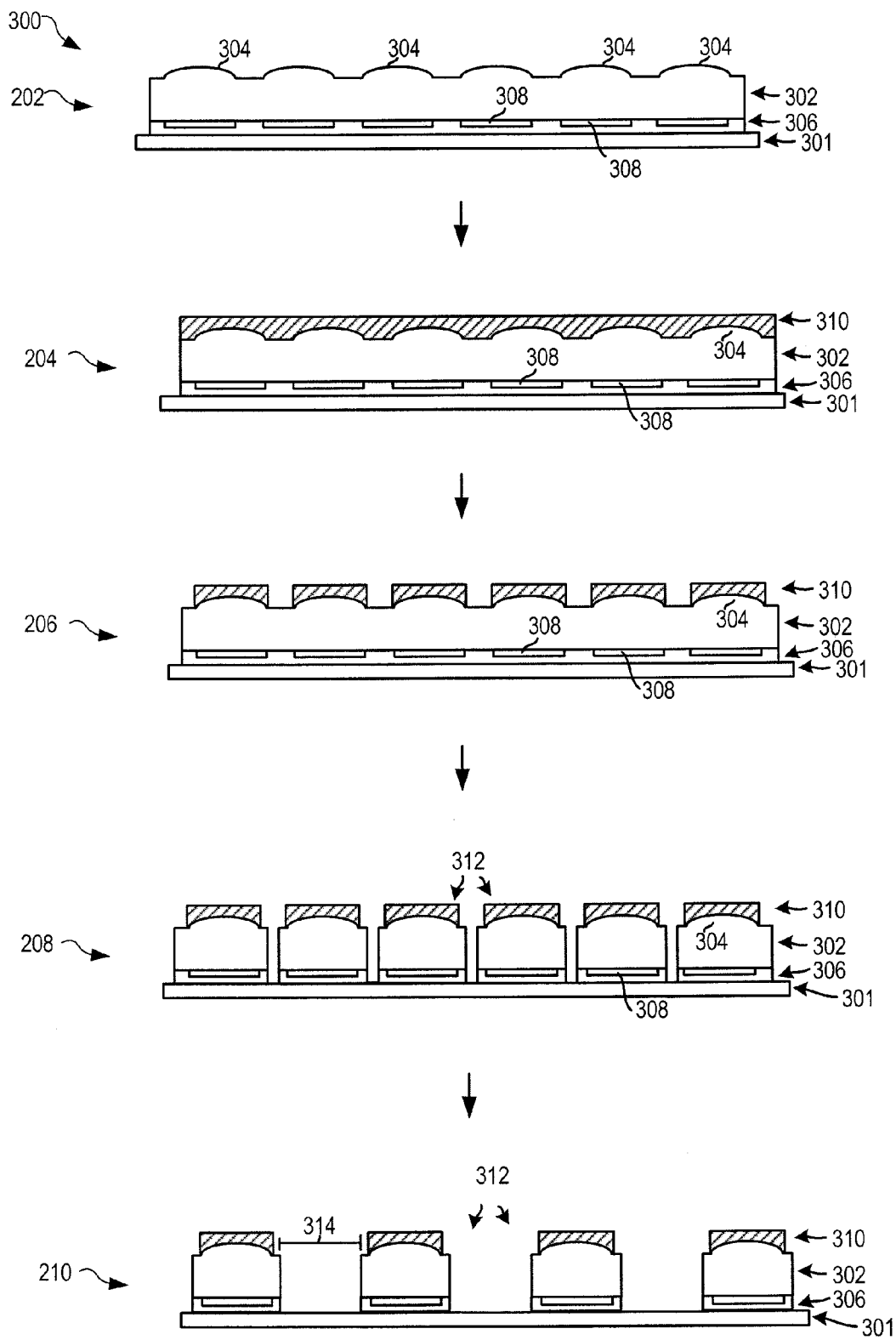
FIGS. 3A-3B depict an exemplary visual diagram of the method of FIG. 2.
Figure 3B:
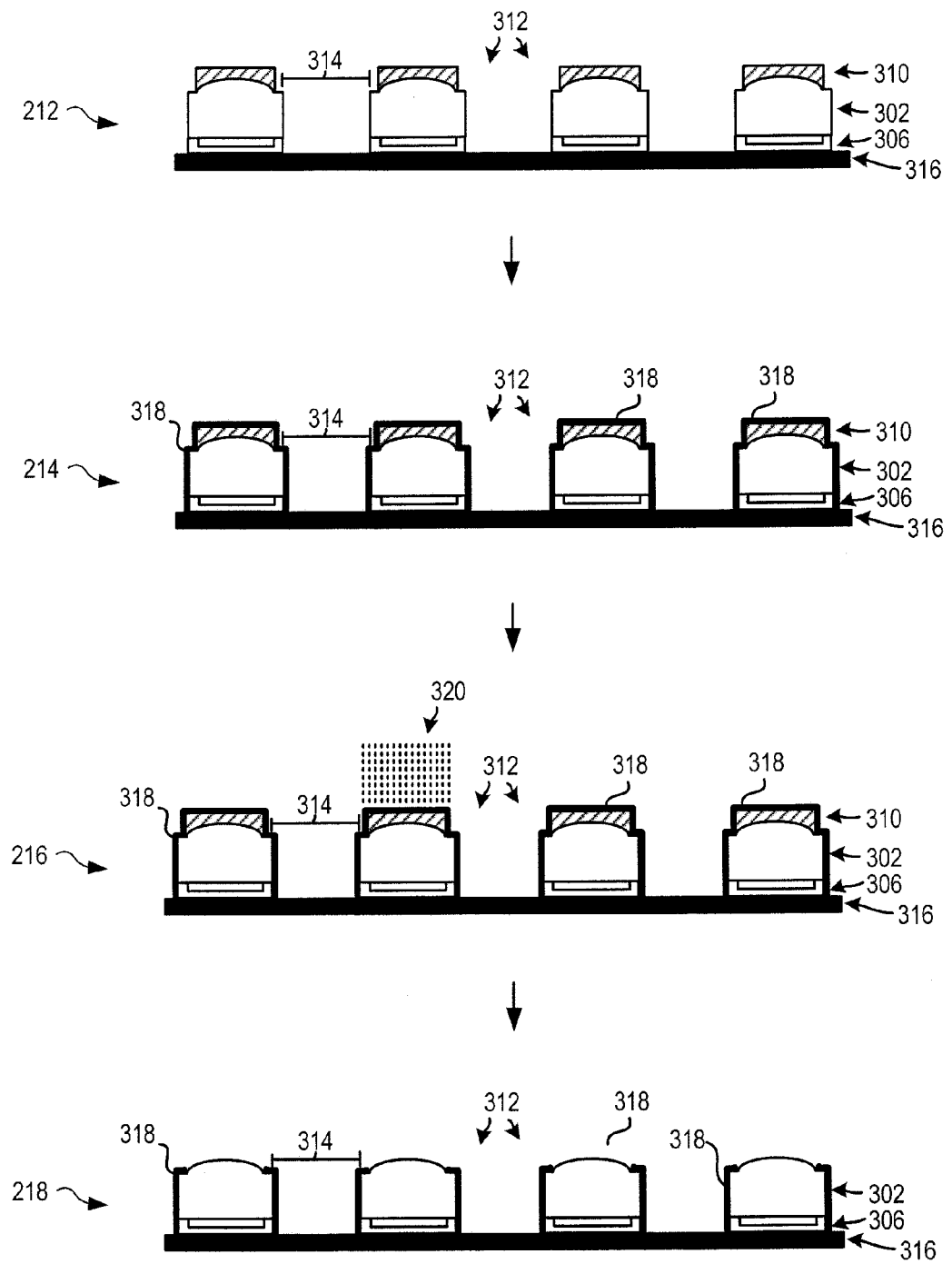

FIG. 2 depicts a method 200 for black coating camera cubes at a wafer level, in one embodiment. FIGS. 3A-3B depict a visual diagram 300 of method 200. FIGS. 2 and 3 are best viewed together with the following description. Note: not all like elements of FIGS. 3A-3B are labeled for clarity of illustrations (for example, not all lens stacks 304, described below, are labeled within the figures). For purposes herein, the term "camera cubes" is defined as a standalone optical system including a sensor and lens stack combination.

In step 202, the lens stack and sensor are bonded together at the wafer level. For example, lens stack wafer 302, having a plurality of undiced lens stacks 304, is bonded to sensor wafer 306 having a plurality of sensors 308 each opposing a respective lens stack 304. Lens stacks 304 may include any configuration of lenses manufactured at the wafer level without departing from the scope hereof. Sensors 308 may include any imaging sensor known in the art suitable for such purpose, such as complementary metal-oxide-semiconductor (CMOS), charge-coupled devices (CCD), NMOS, or similar devices. Lens stacks 304 may be bonded on dicing tape 301 for dicing as discussed below.

In step 204, a mask layer is applied on top of the bonded lens stack/sensor groups. For example, mask layer 310 may be applied, at the wafer level, on top of lens stack 302. Mask layer 310 may be any resist or dry film known in the art of standard lithography.

In step 206, the mask layer is patterned. For example, mask layer 310 may be patterned via known lithography etching or patterning processes. The resulting item includes a mask layer only on the portions of lens stack that black coating is not desired.

In step 208, the bonded lens stack and sensors are diced into individual camera cubes. For example, the lens stack 302 and sensors 304 bonded thereto are diced into individual camera cubes 312.

In step 210, method 200 expands the gap between each of the individual camera cubes. For example, the gap 314 between each individual camera cube 312 is expanded to a desired distance. The expansion process of step 210 is discussed in further detail below with regards to FIG. 4.

In step 212, method 200 transfers the stretched camera cubes to a bottom masking layer. For example, camera cubes 312 are transferred to bottom masking layer 316.

In step 214, method 200 applies a black coating layer. For example, camera cubes 312 are coated with black coating layer 318.

In step 216, method 200 laser trims a path through the black coating layer added in step 214. For example, the laser (indicated by dashed lines 320) cuts a path through black coating layer 318 to allow lift off of masking material 310 from camera cubes 312. In one embodiment, the laser trimming step 216 provides a path for the stripping chemical to reach masking material 310.

In step 218, method 200 performs a lift off process to remove the masking material. Once the masking material 310 is exposed, the entire wafer of camera cubes 312 is soaked in a stripping chemical to remove the masking material 310. The black coating material 318 includes properties that are not affected by the stripping material, therefore the camera cubes 312 remain black coated in the areas not laser trimmed. In one embodiment, step 218 involves a fixture that holds the units in the stripping chemical while the solution is being agitated.

Once step 218 is completed, each individual camera cube 312 may be removed from the wafer, therefore resulting in an individual black coated camera cube.

Steps 202 through 208 are optional, as indicated by dashed lines 220, and may be performed in alternate manners to those disclosed herein. In particular, these steps are discussed in greater detail within the specification of U.S. patent application entitled "Systems and Method for Wafer Level Bonding Process". Additionally, it should be appreciated that the order of the steps of method 200 as illustrated is for illustrative purposes only and is not intended to be limiting in scope herein.

Method 200 provides significant advantages over the prior art. For example, method 200 allows for the handling of an entire wafer of camera cubes (sometimes over 4000 units in a single wafer). This processing of an entire wafer at one time saves significant time and manual effort required to handle each camera cube independently.

Figure 4:
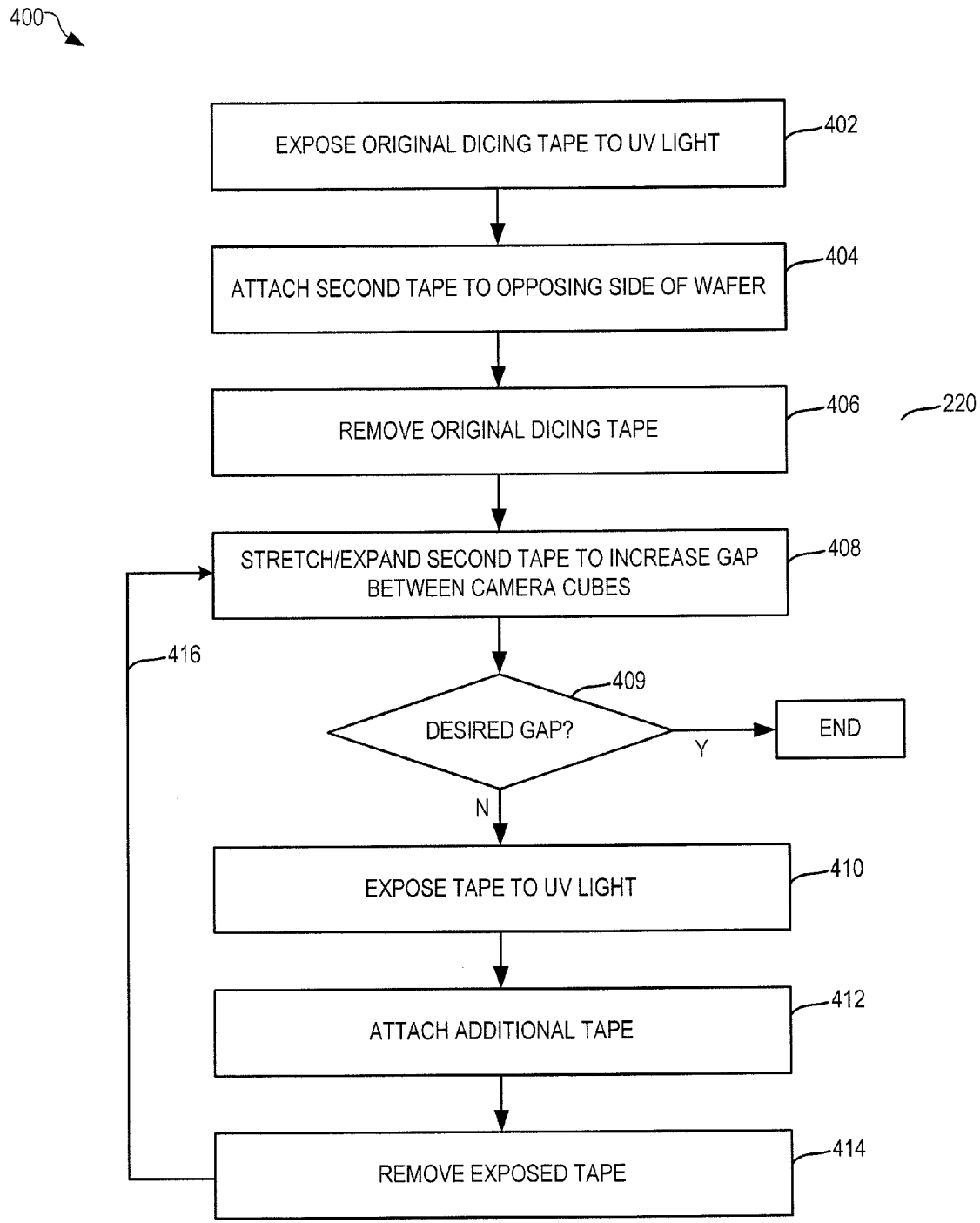
FIG. 4 depicts an exemplary method for expanding the spacing between individual camera cubes of a wafer.
Figure 5A:
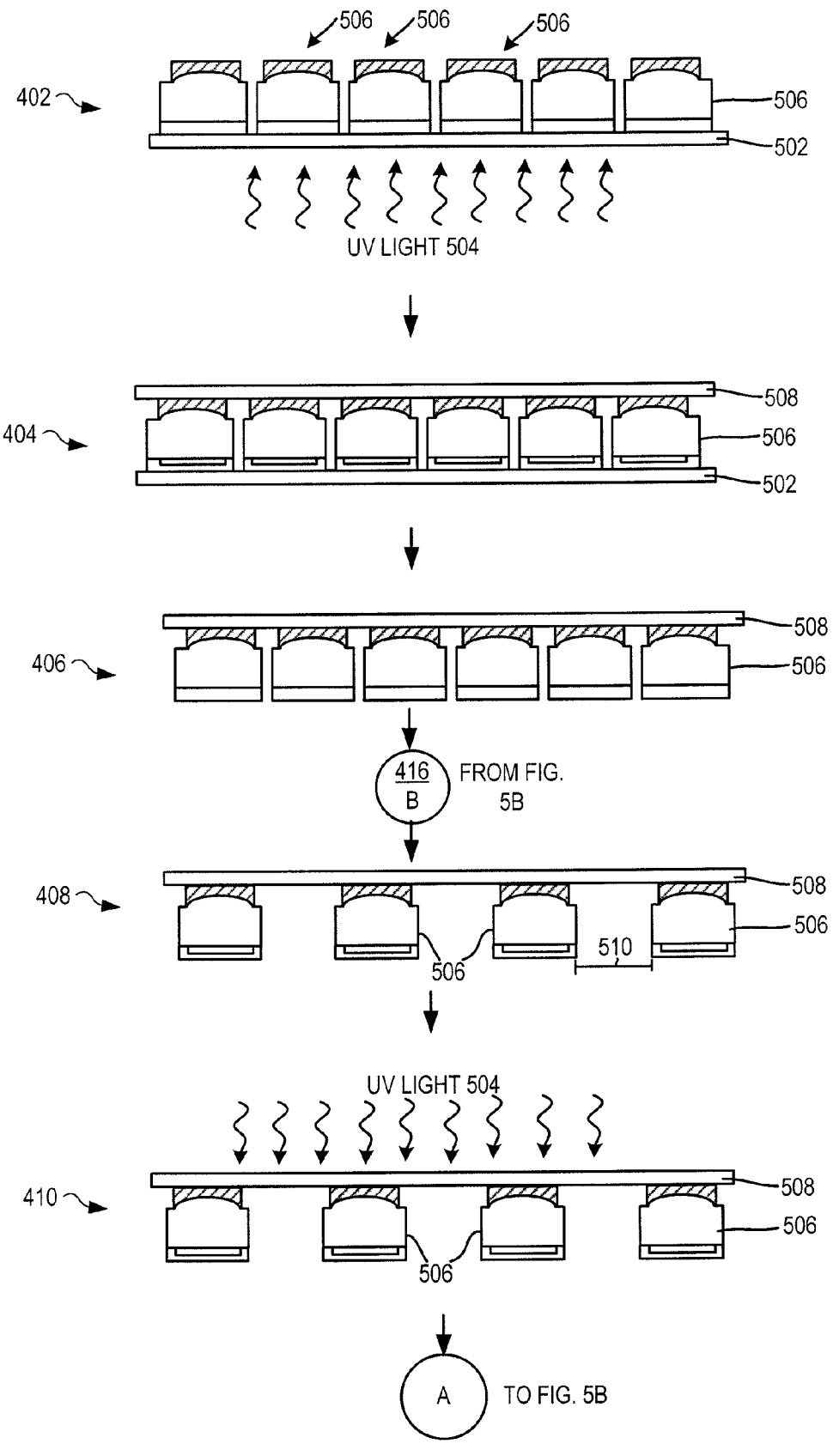
FIGS. 5A-5B depict an exemplary visual diagram of the method of FIG. 4.
Figure 5B:
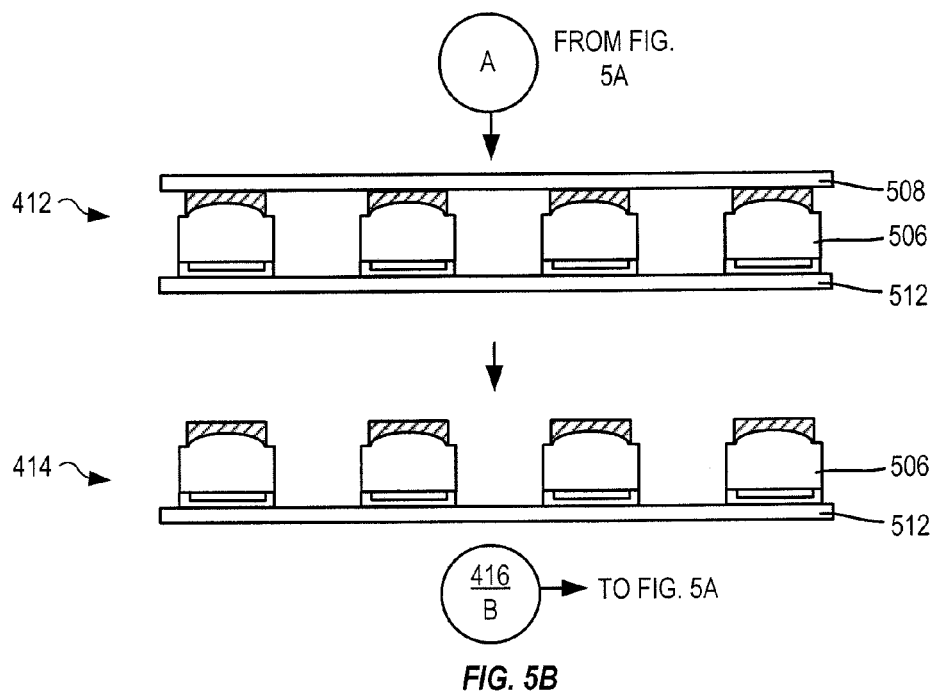
Figure 6:
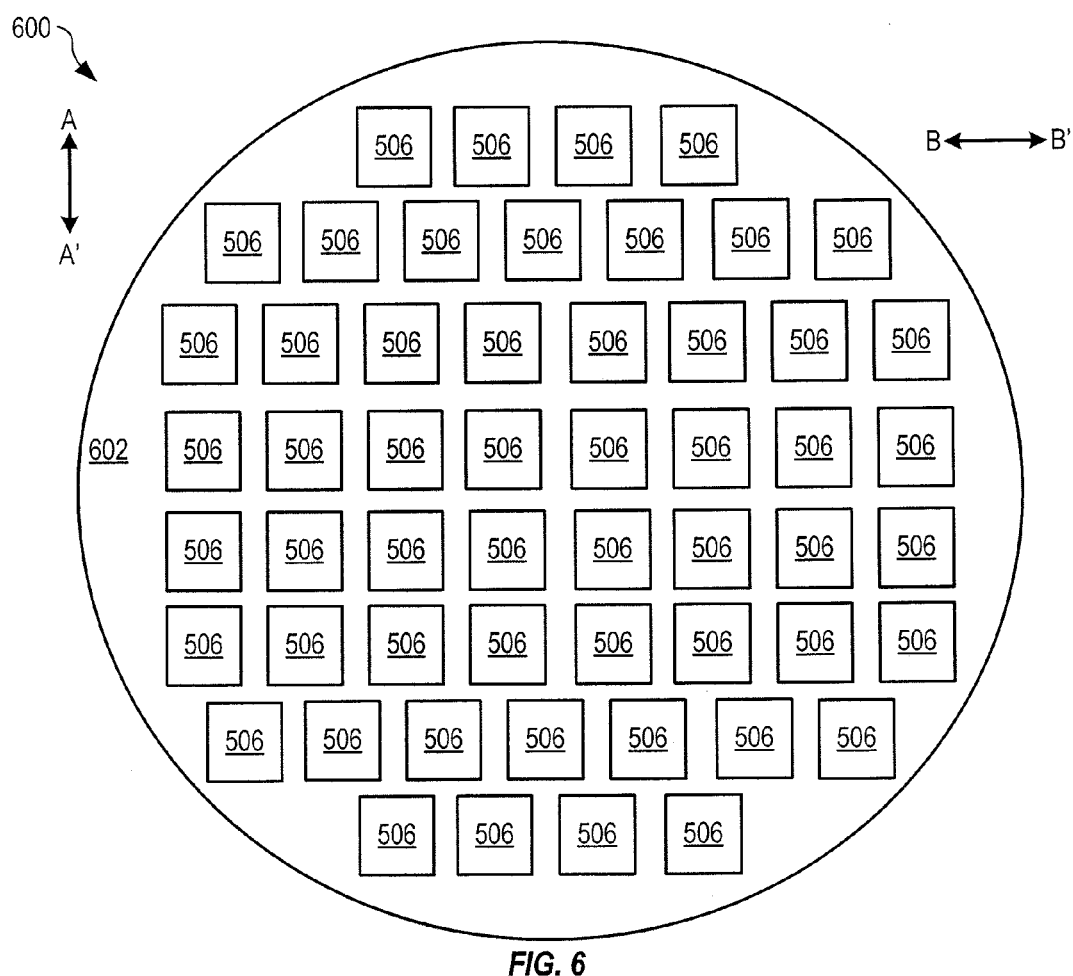
FIG. 6 depicts a top plan view of an exemplary diced wafer having a plurality of sensor/wafer groups, in one embodiment.

FIG. 4 depicts an exemplary method 400 for expanding the spacing between individual camera cubes of a wafer. FIG. 5 depicts a visual diagram 500 of method 400. FIG. 6 depicts a top plan view 600 of an exemplary diced wafer 602 having a plurality of sensor/wafer groups 506, in one embodiment. FIGS. 4-6 are best viewed together with the following description.

Method 400 is one embodiment for performing step 210 of method 200, discussed above. Expansion method 400 stretches dicing tape 301 to enlarge the gap between diced units. Method 400 occurs after the sensor and lens stack is bonded together and diced (i.e. after step 208). Expansion can be performed once with a single tape, or repeated multiple times by transferring the stack from one dicing tape to another as many times as desired. Often, it is advantageous to utilize numerous dicing tape transfers because the further a particular dicing tape is stretched, the less uniform the spacing between each camera cube becomes. Therefore, smaller stretches on numerous dicing tapes is advantageous in some instances. Therefore, the number of stretches is dependent on the spacing and uniformity desired.

In step 402, method 400 exposes the original dicing tape, located on a first side of the sensor/lens group bonded wafer, to ultra-violet (UV) light to delaminate the original dicing tape. For example, tape 502 is exposed to UV light 504 such that the adhesive properties of tape 502 are substantially reduced, and therefore tape 502 is not strongly adhered to sensor/lens group 506. Tape 502 may for example be an adhesive tape having particularly strong adhesive strength, and further characterized such that the adhesive strength characteristic is substantially reduced after irradiation by UV light. Further, it should be appreciated that sensor/lens group 506 may or may not include masking material at this stage of the manufacturing process; however, for the purposes of expansion method 400, the presence of masking material on sensor/lens group 506 is unrelated.

In step 404, method 400 attaches a second tape to an opposing side of sensor/lens group wafer. In one example of step 404, second tape 508 is laminated on an opposing side (i.e. the side containing masking layer) of the diced wafer containing sensor/lens groups 506. Tape 508 may for example be an adhesive tape having particularly strong adhesive strength, and further characterized such that the adhesive strength characteristic is substantially reduced after irradiation by UV light. In one embodiment, step 404 must occur after step 402 to insure that second tape 508 is not irradiated with any UV light during step 402, thereby maintaining the adhesive strength of second tape 508. In an alternate embodiment, step 404 occurs before step 402, the UV light 504 is applied in the specific location of first tape 502 to insure that second tape 508 is not irradiated by UV light 504.

In step 406, method 400 removes first tape from the sensor/lens groups 506. For example, first tape 502 is pulled off of group 506.

In step 408, method 400 stretches/expands second tape to increase the gap between individual ones of the sensor/lens groups. In one example of step 408, second tape 508 is stretched to increase the gap 510 between individual ones of the sensor/lens groups 506.

Step 409 is a decision. If, in step 409, it is determined that the gap between each sensor/lens group 506 is above a desired threshold, method 400 ends. If, in step 409, it is determined that the gap between sensor/lens groups 506 is not above the desired threshold, method 400 proceeds to step 410.

In step 410, method 400 exposes the second tape to ultra-violet (UV) light to delaminate the second tape. For example, second tape 508 is exposed to UV light 504 such that the adhesive properties of tape 508 are substantially reduced, and therefore tape 508 is not strongly adhered to sensor/lens group 506.

In step 412, method 400 attaches an additional tape to an opposing side of sensor/lens group wafer to the second tape. In one example of step 412, additional tape 512 is laminated on an opposing side (i.e. the side opposing second tape 508) of the diced wafer containing sensor/lens groups 506. Tape 512 may for example be an adhesive tape having particularly strong adhesive strength, and further characterized such that the adhesive strength characteristic is substantially reduced after irradiation by UV light. In one embodiment, step 412 must occur after step 410 to insure that additional tape 512 is not irradiated with any UV light during step 410, thereby maintaining the adhesive strength of additional tape 512. In an alternate embodiment, step 412 occurs before step 410, the UV light 504 is applied in the specific location of second tape 508 to insure that additional tape 512 is not irradiated by UV light 504.

In step 414, method 400 removes second tape 508 from the sensor/lens groups.

Method 400 then repeats steps 408-414 with additional pieces of tape until a desired gap 510 is between each of the sensor/lens groups 506, as indicated by line 416. It should be appreciated that although the illustrated examples within FIGS. 5A and 5B are two dimensional, the stretching/expanding may occur in more than one direction. For example, referring to FIG. 6, the first iteration of steps 408-414 may stretch the wafer 602 along the direction of line A-A' and the second iteration of steps 408-414 may stretch the wafer 602 along the direction of line B-B'. Any other directional stretching may occur without departing from the scope hereof.

Changes may be made in the above methods and systems without departing from the scope hereof. It should thus be noted that the matter contained in the above description or shown in the accompanying drawings should be interpreted as illustrative and not in a limiting sense. The following claims are intended to cover all generic and specific features described herein, as well as all statements of the scope of the present method and system, which, as a matter of language, might be said to fall therebetween.

What is claimed is:

1. A method for black coating camera cubes at wafer level, the method comprising:
   stretching a first tape attached to a wafer of camera cubes to increase a gap between individual camera cubes;
   applying a layer of black coating material to the wafer of the camera cubes;
   laser trimming a pattern within the layer of black coating, the pattern defining undesired portions of the black coating material to be removed;
   lifting off the undesired portions of the black coating material from the wafer prior to singulating each individual camera cube from the wafer;
   coating the camera cubes with a masking portion corresponding to portions of the camera cubes where black coating is not desired;
   wherein the step of lifting off comprises applying a stripping chemical to remove the masking portion via the laser trimmed pattern.

2. The method of claim 1, wherein the pattern corresponds to the masking portion.

3. The method of claim 1, wherein the step of lifting off is performed with a fixture that holds the wafer and camera cubes while the stripping chemical is agitated.

4. The method of claim 1, further comprising, after the step of stretching, transferring the wafer of camera cubes to a bottom masking layer.

5. A method for black coating camera cubes at wafer level, the method comprising:
   stretching a first tape attached to a wafer of the-camera cubes to increase a gap between individual ones of the camera cubes;
   applying a layer of black coating material to the wafer of the camera cubes;
   laser trimming a pattern within the layer of black coating, the pattern defining undesired portions of the black coating material to be removed;
   lifting off the undesired portions of the black coating material from the wafer prior to singulating each individual camera cube from the wafer;
   wherein the step of stretching comprises:
   stretching the first tape in a first direction to increase the gap to a first distance;
   applying ultraviolet (UV) light to the first tape;
   attaching a second tape to the wafer of camera cubes on an opposing side of the wafer opposite the first tape;
   removing the first tape; and,
   stretching the second tape to increase the gap a second distance.

6. The method of claim 5, wherein the step of stretching the second tape comprises stretching the second tape in a second direction different from the first direction.

7. The method of claim 5, further comprising applying UV light to the second tape; and repeating the steps of attaching, removing, stretching and applying UV light for an additional tape until the gap is at a desired threshold.

8. The method of claim 7, wherein for each additional tape, the additional tape is stretched in a different direction.

9. The method of claim 5, wherein the step of applying UV light occurs after the step of attaching a second tape, and wherein the UV light is applied only at a location of the first tape.

10. A method for increasing a gap between individual camera cubes on a single wafer of a plurality of camera cubes, the method comprising:
    stretching, in a first direction, a first tape attached to the wafer of camera cubes to increase the gap to a first distance
    applying ultraviolet (UV) light to the first tape;
    attaching a second tape to the wafer of camera cubes on an opposing side of the wafer opposite of the first tape;
    removing the first tape; and
    stretching the second tape to increase the gap a second distance.

11. The method of claim 10, wherein the step of stretching the second tape comprises stretching the second tape in a second direction different from the first direction.

12. The method of claim 10, further comprising applying UV light to the second tape; and repeating the steps of attaching, removing, stretching and applying UV light for an additional tape until the gap is at a desired threshold.

13. The method of claim 12, wherein for each additional tape, the additional tape is stretched in a different direction.

14. The method of claim 10, wherein the step of applying UV light occurs after the step of attaching a second tape, and wherein the UV light is applied only at a location of the first tape.

* * * * *